United States Patent [19]

Park

[11] Patent Number: 5,420,533

[45] Date of Patent: May 30, 1995

[54] PULL-DOWN CIRCUIT FOR WIDE VOLTAGE OPERATION

[75] Inventor: Yeon J. Park, Chungcheongbuk-do, Rep. of Korea

[73] Assignee: Goldstar Electron Co., Ltd., Rep. of Korea

[21] Appl. No.: 173,995

[22] Filed: Dec. 28, 1993

[51] Int. Cl.[6] .................. H03K 17/687; H03L 5/00
[52] U.S. Cl. ......................... 327/387; 327/434; 327/208; 327/306; 365/190
[58] Field of Search ............ 307/584, 577, 575, 572, 307/363, 354, 264; 365/190, 189.07; 326/80; 327/379, 208, 78, 306, 387, 389, 434

[56] References Cited

U.S. PATENT DOCUMENTS

| | | | |
|---|---|---|---|
| 3,942,039 | 3/1976 | Kikuchi et al. | 307/572 |
| 5,289,415 | 2/1994 | Dimarco et al. | 365/190 |
| 5,305,264 | 4/1994 | Takahashi | 365/190 |
| 5,338,978 | 8/1994 | Larsen et al. | 307/475 |
| 5,341,045 | 8/1994 | Almulla | 307/451 |

Primary Examiner—Timothy P. Callahan
Assistant Examiner—Terry L. Englund
Attorney, Agent, or Firm—Poms, Smith, Lande & Rose

[57] ABSTRACT

A pull-down circuit for wide voltage operation including a ninth N-MOS transistor and a tenth N-MOS transistor each having a drain electrode connected to a data line and a source electrode grounded, an eleventh N-MOS transistor and a twelfth N-MOS transistor connected to each other in series between gates of the ninth and tenth N-MOS transistors and an output of a controller for controlling the pull-down circuit, each of the eleventh and twelfth N-MOS transistors having a gate electrode and a drain electrode connected with each other, and a thirteenth N-MOS transistor having a gate electrode adapted to receive a signal from the controller, a drain electrode connected to a source electrode of the twelfth N-MOS transistor, and a source electrode grounded. The pull-down circuit performs a pull-down operation at a voltage level of above 3 V and does not perform the pull-down operation at a voltage level of 3 V or below.

5 Claims, 4 Drawing Sheets

FIG.3

| VCC | 1.8/2u | 1/3u | no pulldown | new model |
|---|---|---|---|---|
| 4.4V | 10.2ns | 13.1ns | 41.8ns | 13.3ns |
| 4.2V | 13.1ns | 18.9ns | 50.8ns | 27.2ns |
| 4.0V | 6.0ns | 17.3ns | 61.1ns | 13.2ns |
| 3.8V | 16.7ns | 28.0ns | 76.0ns | 20.2ns |
| 3.6V | 27.5ns | 29.2ns | 94.8ns | 32.7ns |
| 3.4V | 19.4ns | 27.6ns | 109.0ns | 53.8ns |
| 3.2V | 11.9ns | 42.2ns | 141.5ns | 108.7ns |
| 3.0V | 14.5ns | 50.5ns | 175.0ns | 158.5ns |
| 2.8V | 18.0ns | 54.0ns | 221.0ns | 217.0ns |
| 2.6V | 23.0ns | 64.0ns | 276.0ns | 276.0ns |
| 2.4V | 28.0ns | 99.0ns | 340.0ns | 340.0ns |

F I G. 4

| Vcc | 1.8/2u | | 1/3u | | NO PULLDOWN | | NEW MODEL | |
|---|---|---|---|---|---|---|---|---|
| | DOUT | ΔV | DOUT | ΔV | DOUT | ΔV | DOUT | ΔV |
| 4.4V | 3.1ns | 102mV | 4.8ns | 164mV | 5.0ns | 371mV | 3.4ns | 104mV |
| 4.0V | 2.9ns | 89mV | 5.8ns | 140mV | 5.6ns | 287mV | 4.1ns | 100mV |
| 3.5V | 3.1ns | 67mV | 5.0ns | 115mV | 6.2ns | 247mV | 6.3ns | 100mV |
| 3.0V | 3.0ns | 38mV | 4.9ns | 86mV | 5.9ns | 212mV | 5.9ns | 116mV |
| 2.8V | 3.1ns | 25mV | 5.3ns | 72mV | 7.7ns | 185mV | 6.8ns | 185mV |
| 2.6V | | 4mV | 6.6ns | 28mV | 7.6ns | 161mV | 7.6ns | 161mV |
| 2.4V | | | 42ns | 10mV | 6.2ns | 134mV | 6.2ns | 134mV |
| 2.2V | | | | | | 133mV | | 133mV |

PULL-DOWN CIRCUIT FOR WIDE VOLTAGE OPERATION

BACKGROUND OF THE INVENTION

The present invention relates to a semiconductor memory device, and more particularly to a pull-down circuit for wide voltage operation of static random access memory (SRAM) devices.

According to the rapid development of semiconductor memory devices, demand for such semiconductor memory devices has been increased in various technical fields so that the devices can be used for a variety of products.

However, the specifications required for individual products are infinitely various. In particular, the supply voltage source has the variety depending on the product characteristic. For individual products, proper semiconductor memory devices are required which can operate to meet the supply voltage sources used for individual products, respectively.

Generally, 5 V operating voltage is used in SRAMs. In case of portable appliances, however, 3 V operating voltage is required. Where a semiconductor memory device has no pull-down circuit, a low read speed is obtained even though the voltage difference between data lines, namely, the sensing voltage is high. This makes it impossible to use the semiconductor memory device. The low read speed results from a low sensibility of a MOS transistor of the semiconductor memory device.

On the other hand, 5 V-operable products equipped with pull-down circuits can perform a normal operation. However, 3 V-operable products equipped with pull-down circuits can perform a read operation for reading a sensing voltage because the sensing voltage is very low. As a result, these products can not be used with 3 V operating voltage.

SUMMARY OF THE INVENTION

Therefore, an object of the invention is to provide a pull-down circuit for wide voltage operation of a SRAM device capable of stably operating even in a wide supply voltage range of supply voltage sources, thereby enabling the SRAM device to use an operating voltage of 3 V to 5 V.

In accordance with the present invention, this object can be accomplished by providing a pull-down circuit for wide voltage operation comprising: a first MOS transistor and a second MOS transistor each having a drain electrode connected to a data line and a source electrode grounded; a third MOS transistor and a fourth MOS transistor connected to each other in series between gates of said first and second MOS transistors and an output of a controller for controlling the pull-down circuit, each of said third and fourth MOS transistors having a gate electrode and a drain electrode connected with each other; and a fifth MOS transistor having a gate electrode adapted to receive a signal from said controller, a drain electrode connected to a source electrode of the fourth MOS transistor, and a source electrode grounded.

BRIEF DESCRIPTION OF THE DRAWINGS

Other objects and aspects of the invention will become apparent from the following description of embodiments with reference to the accompanying drawings in which:

FIG. 3 is a table describing the result of a bump test; and

FIG. 4 is a table describing a variation in sensing level depending on supply voltage.

DETAILED DESCRIPTION OF THE PREFERRED EMBODIMENTS

For an easy understanding of a pull-down circuit for wide voltage operation in accordance with the present invention, a conventional pull-down circuit will be described before describing the pull-down circuit of the present invention.

Figure 1:
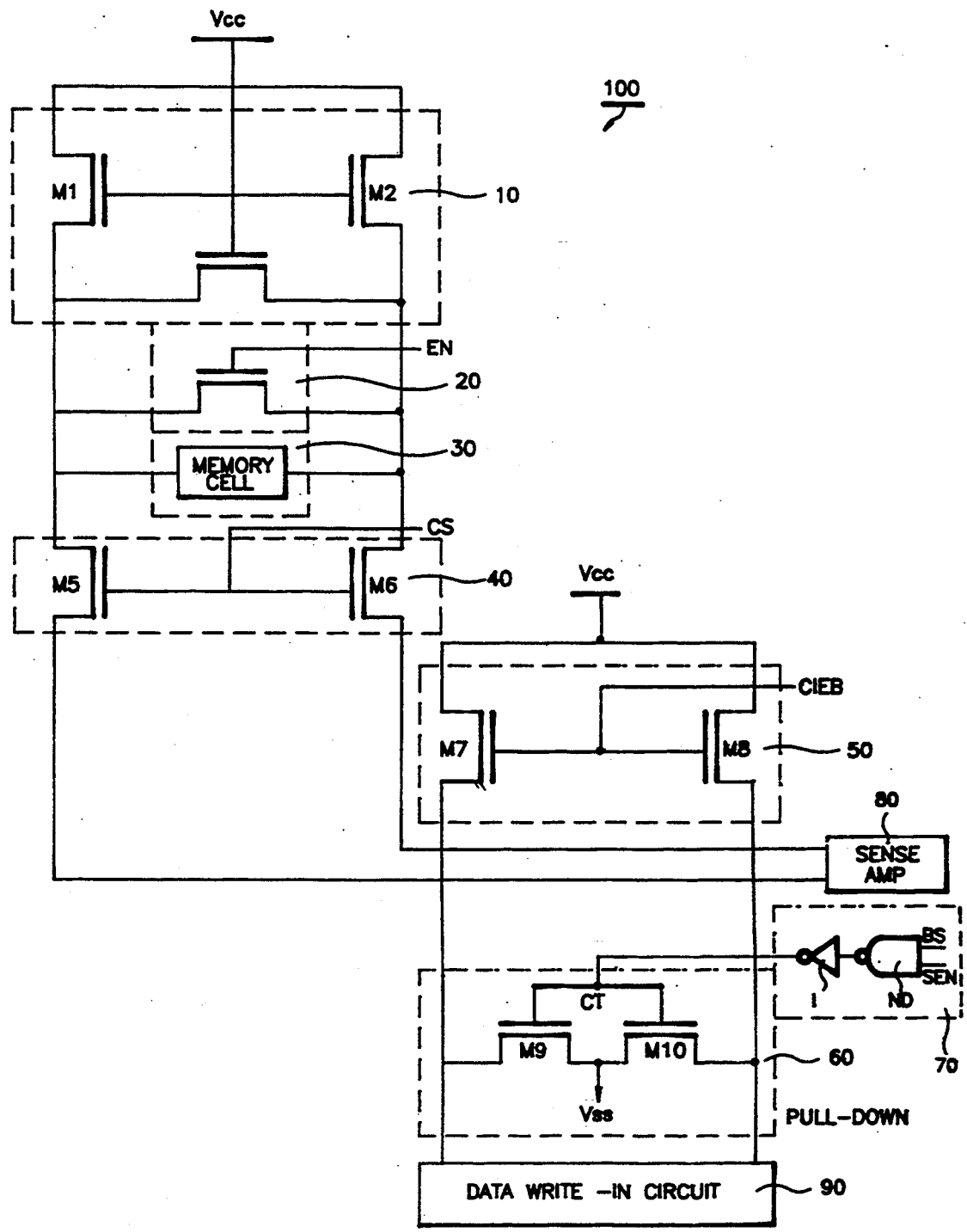
FIG. 1 is a circuit diagram of a peripheral circuit of a conventional semiconductor memory device.

FIG. 1 shows a peripheral circuit of a conventional semiconductor memory device. In FIG. 1, the peripheral circuit is denoted by the reference numeral 100.

As shown in FIG. 1, the peripheral circuit 100 includes a pull-up circuit 10 for pulling up DC potential of bit lines, an equalizer 20 for equalizing potential levels of the bit lines, a memory cell array 30, a column selector 40, a chip enable circuit 50, a pull-down circuit 60 for pulling down DC potential of the data lines, a controller 70 for controlling the pull-down circuit 60, a sense amplifier 80 for sensing the potential of the data lines, and a data write-in circuit 90.

The pull-up circuit 10 comprises a first N-MOS transistor M1, a second N-MOS transistor M2, and a third N-MOS transistor M3. These N-MOS transistors M1 to M3 are connected at their gate electrodes to a voltage source Vcc to receive a voltage from the voltage source Vcc. The first and second N-MOS transistors M1 and M2 are connected at their drain electrodes to the voltage source Vcc.

The drain and source electrodes of the third N-MOS transistor M3 are connected to the source electrodes of the first and second N-MOS transistors M1 and M2, respectively. They are also connected to a pair of bit lines of the memory cell array 30, respectively.

The equalizer 20 comprises a fourth N-MOS transistor M4 which has a gate electrode adapted to receive an equalize enable signal EN. The drain and source electrodes of the fourth N-MOS transistor M4 are connected to the bit lines of the memory cell array 30, respectively.

The column selector 40 comprises a fifth N-MOS transistor M5 and sixth N-MOS transistor M6 each of which has a gate electrode adapted to receive a column select signal CS. The drain electrodes of the fifth and sixth N-MOS transistors M5 and M6 are connected to the bit lines of the memory cell array 30, respectively, and the source electrodes of the fifth and sixth N-MOS transistors M5 and M6 are connected to the data lines of the sense amp 80, respectively.

The chip enable circuit 50 comprises a seventh N-MOS transistor M7 and a eighth N-MOS transistor M8. Each of these N-MOS transistors M7 and M8 has a gate electrode adapted to receive a chip enable signal CIEB and a drain electrode adapted to a voltage from the voltage source Vcc. The source electrodes of the N-MOS transistors M7 and M8 are connected to the data lines of the memory cell array 30, respectively.

The pull-down circuit 60 comprises a ninth N-MOS transistor M9 and a tenth N-MOS transistor M10. Each of these N-MOS transistors M9 and M10 has a gate electrode adapted to receive a control signal CT and a source electrode grounded. The drain electrodes of the N-MOS transistors M9 and M10 are connected to the data lines of the memory cell array 30, respectively.

The controller 70 is adapted to receive a sense enable signal SEN and a block select signal BS from a decoder (not shown) and generate a control signal CT based on the received signals. The controller 70 comprises a NAND gate ND adapted to receive the sense enable signal SEN and the block select signal BS and NAND-gate them, and an inverter I adapted to invert an output signal of the NAND gate ND.

The pull-up circuit 10 serves to raise the DC potential of the bit lines.

As an equalize enable signal EN is applied to the gate electrode of the N-MOS transistor M4 of equalizer 20, the two bit lines are equalized in DC potential level. Where both the sense enable signal SEN and the block select signal have a high voltage level, the NAND gate ND of the controller 70 outputs a low level signal. This low level signal from the NAND gate ND is inverted into a high level signal by the inverter I which, in turn, applies the high level signal to the pull-down circuit 60.

The gate electrodes of the N-MOS transistors M9 and M10 of pull-down circuit 60 are turned on by the high levelsignal received from the controller 70. As a result, potential of the data lines is lowered by the turn-on resistance of the N-MOS transistors M9 and M10.

As a column signal of high level is applied to the gate electrodes of the N-MOS transistors M5 and M6 of the column selector 40 under the above condition, the N-MOS transistors M5 and M6 are turned on. As a result, the bit lines of the memory cell array 30 are communicated with the data lines, so that a DC potential difference of the bit lines can be transmitted to the data lines.

The sense amplifier 80 reads DC potential of the data lines. When the sense amplifier 80 operates, the pull-down circuit 60 always operates to drop the potential of the data lines.

By this operation of the pull-down circuit 60, the sense amplifier 80 operates normally at a voltage level of 5 V. At a voltage level of 3 V, however, the sense amplifier 80 can not receive potential difference of the data line corresponding to the potential difference of the bit lines generated in the memory cell array 30 because the potential of the data lines is very low at a voltage level of 3 V. This reason will be described hereinafter.

Now, the pull-down circuit for wide voltage operation in accordance with the present invention will be described, in conjunction with FIG. 2.

Figure 2:
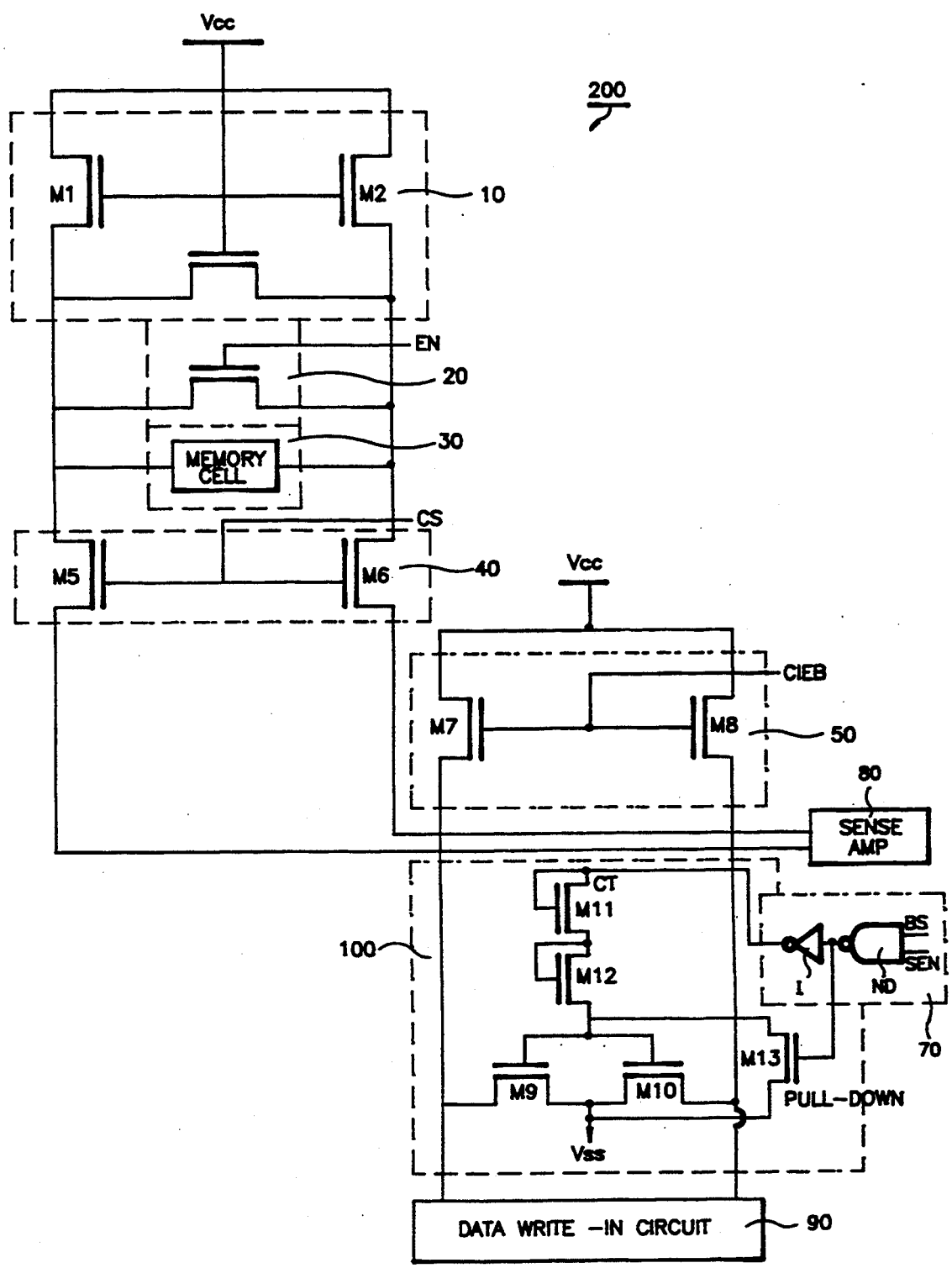
FIG. 2 is a circuit diagram of a peripheral circuit of a semiconductor memory device in which a pull-down circuit in accordance with the present invention is employed.

FIG. 2 shows a peripheral circuit of a semiconductor memory device which employs the pull-down circuit of the present invention. The peripheral circuit 200 of FIG. 2 has the same construction as that of FIG. 1, except for the pull-down circuit. In FIG. 2, the pull-down circuit is denoted by the reference numeral 100 and elements corresponding to those of FIG. 1 are denoted by the same reference numerals.

As shown in FIG. 2, the pull-down circuit 100 of the present invention comprises a ninth N-MOS transistor M9 and a tenth N-MOS transistor M10. Each of these N-MOS transistors M9 and M10 has a gate electrode adapted to receive a control signal CT and a source electrode grounded. The drain electrodes of the N-MOS transistors M9 and M10 are connected to the data lines of the memory cell array 30, respectively. The pull-down circuit 100 further comprises an eleventh N-MOS transistor M11 and a twelfth N-MOS transistor M12. These N-MOS transistors M11 and M12 are connected in series between the gates of the ninth and tenth N-MOS transistors M9 and M10 and the inverter I of the controller 70. Each of the N-MOS transistors M11 and M12 has an inter-connection between its gate and drain electrodes. The pull-down circuit 100 further comprises a thirteenth N-MOS transistor M13 having a gate electrode adapted to receive an output signal from the NAND gate ND of controller 70, a drain electrode connected to the source electrode of the twelfth N-MOS transistor M12, and a source electrode grounded.

Operation of the pull-down circuit in accordance with the present invention will now be described.

First, the description will be made in conjunction with a case that the pull-down circuit 100 operates at a voltage level of 5 V.

At a turn-on state of the sense amplifier 80, a high level output signal from the controller 70 is applied to the pull-down circuit 100. At this time, the eleventh N-MOS transistor M11 receives the output signal from the inverter I through its gate electrode, so that it can be turned on. Then, a voltage dropped by the threshold voltage of the eleventh N-MOS transistor M11 is applied from the source electrode of the eleventh N-MOS transistor M11 to the gate electrode of the twelfth N-MOS transistor M12. As a result, the twelfth N-MOS transistor M12 is turned on. In similar to the eleventh N-MOS transistor M11, the twelfth N-MOS transistor M12 performs a voltage drop by the threshold voltage thereof. The dropped voltage is applied to the gate electrodes of the ninth and tenth N-MOS transistors M9 and M10.

Thus the ninth and tenth N-MOS transistors M9 and M10 receive a voltage dropped by the threshold voltage of the eleventh and twelfth N-MOS transistors M11 and M12. That is, they receive the voltage of 3.2 V dropped by the threshold voltage 1.8 v.

As a result, the ninth and tenth N-MOS transistors M9 and M10 are turned on, thereby enabling a pull-down operation of the pull-down circuit 100.

Where the pull-down circuit 100 operates at a voltage level of 3 V, however, the ninth and tenth N-MOS transistors M9 and M10 are turned off because they receives at their gates a voltage of 1.2 V dropped by the threshold voltage of 1.8 V of the series-connected eleventh and twelfth N-MOS transistors M11 and M12. As a result, no pull-down operation is carried out at the voltage level of 3 V.

The thirteenth N-MOS transistor M13 is adapted to maintain the pull-down circuit 100 at its low level state when the sense amplifier 80 is turned off. At the turn-off state of the sense amplifier 80, the NAND gate ND of the controller 70 outputs a high level signal. Upon receiving the high level signal from the NAND gate ND, the thirteenth N-MOS transistor M13 is turned on. As a result, the gate electrodes of the ninth and tenth N-MOS transistors M9 and M10 receive the ground voltage Vss via the thirteenth N-MOS transistor M13.

FIG. 3 is a table describing the result of a bump test.

FIG. 4 is a table describing a variation in sensing level $\Delta V$ depending on supply voltage Vcc.

As apparent from the above description, the present invention provides a pull-down circuit which performs a pull-down operation at a voltage level of above 3 V and does not perform the pull-down operation at a voltage level of 3 V or below, thereby capable of using both the 5 V voltage source and the 3 V voltage source.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A pull-down circuit for wide voltage operation comprising:

a first MOS transistor and a second MOS transistor each having a drain electrode connected to a data line and a source electrode grounded;

a third MOS transistor and a fourth MOS transistor connected to each other in series between gates of said first and second MOS transistors and an output of a controller for controlling the pull-down circuit, each of said third and fourth MOS transistors having a gate electrode and a drain electrode connected with each other; and a fifth MOS transistor having a gate electrode adapted to receive a signal from said controller, a drain electrode connected to a source electrode of the fourth MOS transistor, and a source electrode grounded.

2. A pull-down circuit in accordance with claim 1, wherein at an operating voltage level of above 3 V, said first to fourth MOS transistors are turned on to perform a pull-down operation.

3. A pull-down circuit in accordance with claim 1, wherein at an operating voltage level of 3 V or below, said first to fourth MOS transistors are turned off to perform no pull-down operation.

4. A pull-down circuit in accordance with claim 1, wherein at a turned-of state of a sense amplifier connected to the data lines, the fifth MOS transistor maintains gate electrodes of said first and second MOS transistors at a low level.

5. A pull-down circuit in accordance with claim 1, wherein said gate electrode of the third MOS transistor receives a signal opposite in level to that received in said gate electrode of the fifth MOS transistor.

* * * * *